United States Patent
Miller et al.

(10) Patent No.: US 6,410,487 B1
(45) Date of Patent: Jun. 25, 2002

(54) LARGE AREA BULK SUPERCONDUCTORS

(75) Inventors: Dean J. Miller, Darien, IL (US); Michael B. Field, Jersey City, NJ (US)

(73) Assignee: The University of Chicago, Chicago, IL (US)

( * ) Notice: Subject to any disclaimer, the term of this patent is extended or adjusted under 35 U.S.C. 154(b) by 82 days.

(21) Appl. No.: 09/619,934

(22) Filed: Jul. 20, 2000

(51) Int. Cl.$^7$ .......................... H01B 12/02; H01L 39/24
(52) U.S. Cl. .................. 505/239; 505/471; 505/450
(58) Field of Search ................................ 505/238, 239, 505/450, 471; 174/125.1; 428/545, 551, 599

(56) References Cited

U.S. PATENT DOCUMENTS

| | | |
|---|---|---|
| 4,939,120 A | 7/1990 | Moon et al. |
| 4,956,336 A | 9/1990 | Salama et al. |
| 5,231,076 A | 7/1993 | Jeong et al. |
| 5,278,137 A | 1/1994 | Morita et al. |
| 5,292,716 A | 3/1994 | Sakai et al. |
| 5,395,820 A | 3/1995 | Murakami et al. |
| 5,739,086 A | 4/1998 | Goyal et al. |
| 5,741,377 A | 4/1998 | Goyal et al. |
| 5,846,912 A | 12/1998 | Selvamanickam et al. |
| 5,898,020 A | 4/1999 | Goyal et al. |
| 5,964,966 A | 10/1999 | Goyal et al. |
| 5,968,877 A | 10/1999 | Budai et al. |
| 6,008,162 A * | 12/1999 | Miura et al. ............ 505/450 |
| 6,106,615 A * | 8/2000 | Goyal et al. ............ 117/108 |
| 6,114,287 A * | 9/2000 | Lee et al. ............... 117/101 |
| 6,256,521 B1 * | 7/2001 | Lee et al. ............... 505/230 |
| 6,296,701 B1 * | 10/2001 | Christen et al. .......... 117/101 |

OTHER PUBLICATIONS

Garcia–Gonzalez et al., "Microstructural analysis of YBa2Cu3Oy thin films deposited on SrTiO3 and LaAIO3 substrates by offzxis magnetron sputtering," Jul. 1995, J. Appl. Phys. 78(1) p. 353–359.*

King et al., "A geometrical rationalization of the special properties of the 14 degree [001] grain boundary in YBa2Cu3O7–b," Oct. 1993, J. Appl. Phys. 74(7), p. 4627–4630.*

Heinig et al. "Strong to weak coupling transition in low misorientation angle thin film YBa2Cu3O7–x bicrystals," Jul. 1999, Phys. Rev. B V60, No. 2, p. 1409–1417.*

Dimos et al., "Superconducting transport properties of gran boundaries in YBa2Cu3O7 bicrystals," Mar. 1990, Phys. Rev. B V41, No. 7, p. 4038–4049.*

Critical Current Densities in Superconducting Y–Ba–Cu–O . . . ; Japanese Journal of Applied Physics, vol. 28, No. 9, Sep. 1989, pp. L 1545–L1548.

Superconductivity of YBa2Cu3O1–X by Addition of Reactive Fine Powders, Sakai et al. Superconductivity Research Laboratory Oct. 15, 1990.

Processing of Large $YBa_2Cu_3O_x$ Domains For Levitation Applications by a $Nd_{1+x}Ba_{2-x}Cu_3Oy$–Seeded Melt–Growth Technique, Journal of Electronic Materials, vol. 23, No., 11 1994.

Extremely Fine Precipitate and Flux Pinning in Melt–Processed $YBa_2Cu_3O_x$ Physica C 213 (1993) 179–184.

* cited by examiner

Primary Examiner—Tom Dunn
Assistant Examiner—Colleen P. Cooke
(74) Attorney, Agent, or Firm—Emrich & Dithmar

(57) ABSTRACT

A bulk superconductor having a thickness of not less than about 100 microns is carried by a polycrystalline textured substrate having misorientation angles at the surface thereof not greater than about 15°; the bulk superconductor may have a thickness of not less than about 100 microns and a surface area of not less than about 50 cm$^2$. The textured substrate may have a thickness not less than about 10 microns and misorientation angles at the surface thereof not greater than about 15°. Also disclosed is a process of manufacturing the bulk superconductor and the polycrystalline biaxially textured substrate material.

24 Claims, 5 Drawing Sheets

Superconductor material carried by a multilayered polycrystalline material

Shaped superconductors

Long-length components

Large area, complex shapes

Arcuate shapes

LARGE AREA BULK SUPERCONDUCTORS

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

FIELD OF THE INVENTION

The present invention relates to a method of producing superconductors with greater thicknesses or bulk compared to thin film superconductors and more particularly to textured, large-area bulk superconductors identified as high temperature superconductors. The invention also relates to the superconductor components or products.

BACKGROUND OF THE INVENTION

Bulk superconductors have increased current carrying capacities and are useful in certain product areas where thin film superconductors lack the required performance. The method employed to produce the bulk superconductors is preferably carried out by producing a biaxially textured sheet of a metal or oxide and using this sheet as a large scale seed in combination with superconductor material in a melt process where the melted superconductor material becomes textured as it solidifies by cooling from the region next to the seed through the thickness or bulk.

U.S. Pat. No. 5,869,431 discloses suitable materials for seeds and for superconductors. In addition to methods disclosed in the '431 patent, some processes in the past have used several individual seeds (spaced apart) with superconductor materials in an attempt to obtain growth of large area bulk material with appropriate texturing. However, uniformity of texturing and melting of the small seeds have been problems.

In this invention, a biaxially textured sheet of oxide or metal is used as a one-piece seed of a size generally that of the desired superconductor component and placed in contact with superconducting material. The superconducting material is melted and then solidified by cooling with solidification starting from a region adjacent to the seed. By this technique, texturing is extended through the bulk of the superconductor with uniformity.

Two techniques for producing the biaxially textured sheet or oxide may be carried out. With a metal such as nickel, the sheet could be rolled and annealed similar to the treatment described for the nickel wire in U.S. patent application Ser. No. 09/568,890 filed May 11, 2000, the disclosure of which is incorporated by reference. Although the metal sheet may have the desired texturing, it may be necessary to add a buffer layer such as an oxide like those disclosed in the '431 patent or other oxides such as MgO to preserve the texturing during the subsequent melt stage. Another process is to form a textured surface of a metal oxide such as MgO by using an inclined substrate deposition (ISD). The ISD or inclined substrate deposition method is disclosed in copending U.S. patent application entitled Method for Preparing High Temperature Superconductor, serial no. 09/621,272 filed on even date herewith by Uthamalingam Balachandran and Michael P. Chudzik, the disclosure of which is incorporated herein in its entirety.

OBJECTS OF THE INVENTION

Accordingly, it is an object of the present invention to provide a bulk superconductor having a thickness of not less than about 100 microns carried by a polycrystalline textured substrate having misorientation angles at the surface thereof not greater than about 15°.

Another object of the invention is to provide a bulk superconductor having a thickness of not less than about 100 microns and a surface area of not less than about 50 cm$^2$ carried by a polycrystalline textured layer or sheet having a thickness not less than about 10 microns and misorientation angles at the surface thereof not greater than about 15°.

Still another object of the invention is to provide a process of manufacturing a bulk superconductor having a thickness not less than about 100 microns, comprising providing a polycrystalline biaxially textured layer or sheet material having a thickness not less than about 10 microns and misorientation angles at the surface thereof not greater than about 15°, and providing a superconductor precursor powder in contact with the polycrystalline biaxially textured substrate material and melting the precursor powders and thereafter cooling the melted powders to grow superconductor material using substantially the entire polycrystalline textured substrate material as a seed to provide a superconductor having a thickness not less than about 100 microns carried by a polycrystalline biaxially textured substrate material.

A final object of the invention is to provide a superconductor having a thickness not less than 100 microns produced by the inventive methods.

SUMMARY OF THE INVENTION

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
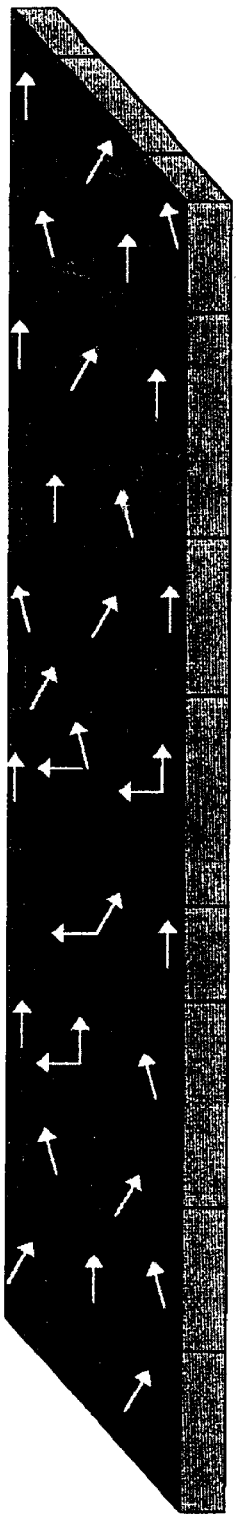
FIG. 1 is a schematic representation of a suitable polycrystalline material.

Most of the effort in making high temperature YBCO superconductors has been concentrated in making wire. Large area superconductors are now being made by joining several smaller ones or by a very labor intensive process to place a large number of seed crystals on a substrate. This invention provides a simple and inexpensive method of making thick and large bulk superconductors. Although YBCO superconductors are used by way of illustration in this application, it is done for purposes of illustration and not for purposes of limitation. Any superconductor material, whether it is a yttria based system, a bismuth based system or a thallium based system or other rare earth element based system may be producible by the method of the present invention and should result in the articles as disclosed by the subject invention. Yttria based systems have been produced.

The principal feature of the invention is the discovery that biaxially textured sheets or layers having substantial thickness, not less than about 10 microns and preferably not less than about 25 microns, can be used as suitable seeds for growing superconductors having a thickness not less than about 100 microns. Bulk superconductors having thicknesses of 1000 microns or 1 cm can be made with the present invention. Moreover, the sheet or layer material can be any polycrystalline textured material capable of acting as a seed for superconductor growth and can withstand temperatures, at which the superconductor crystals grow and which have misorientation angles at the surface thereof, before melting and cooling of the superconductor precursor powders, not greater than about 15°; see the Veal '431 patent, for suitable oxide materials. Preferably, the initial misorientation angles of the textured layer or sheet at the surface thereof are not greater than about 10°.

Although magnesium oxide is illustrated by way of example in this application, the invention is not limited to magnesium oxide as a great many oxide materials are suitable for the inventive process and resultant articles. For instance, those materials set forth in the Veal et al. U.S. Pat. No. 5,869,431 issued Feb. 9, 1999, the entire disclosure which is herein incorporated by reference, are suitable polycrystalline layer or sheet materials for the present invention. For instance, acceptable substrates can be made from one or more of $MgO$, $SrTiO_3$, $LaAlO_3$, cubic stabilized $ZrO_2$, $PbTiO_2$, $Sr_2RuO_4$, $NdGaO_3$, $LaCrO_3$, $NdCrO_3$, $LaFeO_3$, $NdFeO_3$, $La_2CuO_4$, $RTiO_3$, where R is La or a rare earth, $GdFeO_3$.

Although the preferred method of producing a polycrystalline textured layer disclosed herein is by the inclined substrate deposition method, hereinafter disclosed, any economical method of producing a thick polycrystalline texture layer having misorientation angles at the surface thereof not greater than about 15° is covered and included in the invention. For instance, biaxially textured sheets have been made by the Ion Beam Assisted Deposition (IBAD) method first disclosed by workers at the Los Alamos National Laboratory. Such textured sheet materials have also been made by the rolling-assisted biaxial textured process (RABiTS method) disclosed by workers at Oakridge and Argonne National Laboratories. Although these methods may be used to produce thick polycrystalline textured sheets or layers wherein the thickness is greater than about 10 microns and preferably greater than 25 microns, the preferred method is the hereinafter described inclined substrate deposition process.

Moreover, the term "having misorientation angles at the surface thereof" is used to designate the measurement of misorientation angles in the polycrystalline textured seed material (layers or sheets) prior to the production of superconducting materials thereon. The reason for this is that superconductor materials are produced by melting a mixture of precursor oxide or carbonate powders of the superconductor material on a surface of the seed material and thereafter a superconductor crystal is produced as grown during the cooling of the material in contact with the seed material. Small seed crystals a traditionally have been used to produce superconducting materials such as those described in the Todt U.S. Pat. No. 5,776,864, the disclosure of which is incorporated herein by reference. However, during formation of the superconductor material from the precursor powders, at least the top surface of the polycrystalline textured seed material will soften or even melt dissolve or melt and as the superconductor material cools and forms, it is impossible, at the present time, to then measure the misorientation angles at the surface of the polycrystalline textured materials. Accordingly, when used herein, misorientation angles at the surface of the textured material refer to the condition of the textured material prior to melting of the precursor powders of the superconductor. Although polycrystalline textured materials having misorientation angles at the surface thereof not greater than about 15° are suitable for the practice of the invention, it is preferred that the misorientation angles at the surface of the polycrystalline textured materials be not greater than about 10°.

Moreover, because some of the polycrystalline textured substrate material may be lost during the formation of the superconductor material, it is necessary that the polycrystalline textured material has a thickness, prior to the formation of the superconductor material, of not less than about 10 microns and preferably not less than about 25 microns.

Referring now to FIG. 1, there is disclosed a representation of a biaxially textured sheet or layer material which has small misalignment between adjacent grains or crystals. As hereinbefore stated, the misorientation angles at the surface of the polycrystalline textured material is not greater than about 15° and preferably not greater than about 10°. As illustrated in a number of patents based on work done at Oakridge National Laboratory, a representative sample of which is U.S. Pat. No. 5,968,877 to Budai et al. biaxially textured metal substrates may be produced by the methods disclosed therein. Those methods are in general what has been previously referred to here as the RABiTS method. However, at the present time, there is no known metal, including alloys, which are available that can withstand the temperatures required to grow superconductor materials using a melt process. Therefore, the invention, at the present time, must be practiced by having a polycrystalline textured substrate which is capable of withstanding the temperatures necessary to melt precursor superconductor powders. Substrates of textured metals having one or more protective ceramic layers are acceptable, as are textured ceramics. Oxides are the preferred ceramic material, although the invention is not so limited.

In FIG. 1, the polycrystalline substrate sheet material, behaves, insofar as superconductor growth is concerned, like a single crystal. The difference is that the polycrystalline sheet materials of the present invention may be made of any material which has the required low misorientation angles and which has the physical characteristics previously set forth. The materials can be rather inexpensive such as magnesium oxide and their use in the thicknesses set forth herein is novel as seed materials to grow thick superconductor materials. Particularly, it is novel to grow superconductors having thicknesses greater than 100 microns, or 1000 microns or 1 cm from large polycrystalline textured materials, particularly where the superconductor produced has a surface area not less than about 50 $cm^2$ or surface areas not less than about 100 $cm^2$. It is particularly new to produce these thick superconductors from inexpensive thick polycrystalline textured materials or layers, wherein the textured material or layers is not less than about 25 microns thick and has misorientation angles at the surface thereof not greater than about 10°.

Figure 2:
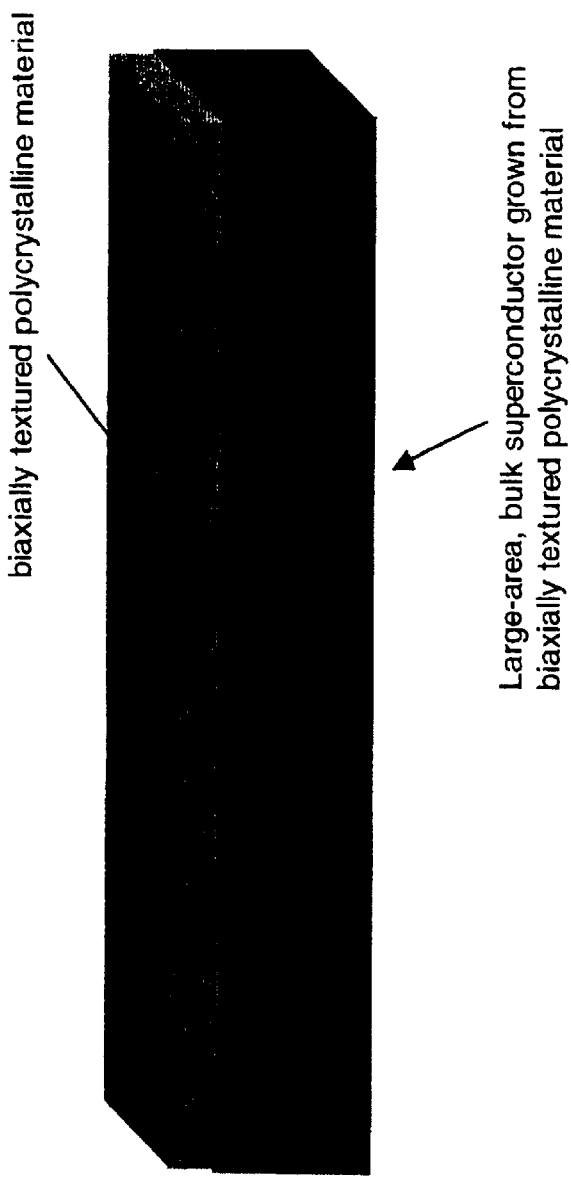
FIG. 2 is a schematic representation of a superconductor material carried by a polycrystalline material.

Referring now to the FIG. 2 of the invention, there is disclosed a combination of a biaxially textured material and a thick superconductor. The combination of thick polycrystalline textured material of the type set forth and thick bulk superconductors is novel, since previous work in the art has been directed to thin film superconducting materials. It is contemplated that the invention includes not only a thick layer of bulk superconductor material (not less than about 100 microns) carried by a textured polycrystalline oxide or other suitable biaxially textured material (not less than about 10 microns in thickness) but a combination of a textured metal layered with a polycrystalline ceramic. Moreover, the polycrystalline substrate may be a plurality of layers of oxide material such as MgO with a layer of $SrTiO_3$ or other oxide on top of the MgO followed by deposited superconductor layer. All these constructions are contemplated by the invention.

Figure 3:
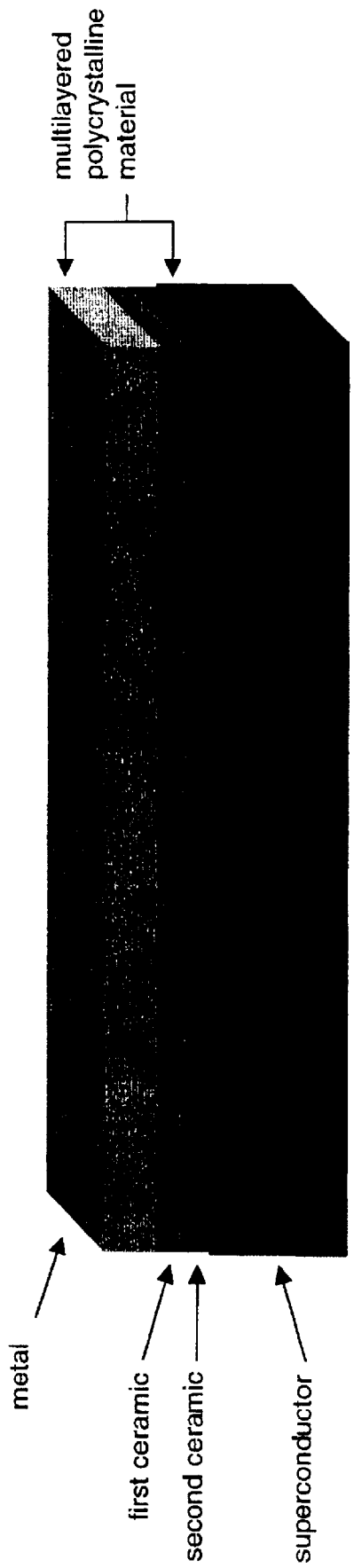
FIG. 3 is a schematic representation of a superconductor material carried by a multilayered polycrystalline material.
Figure 4:
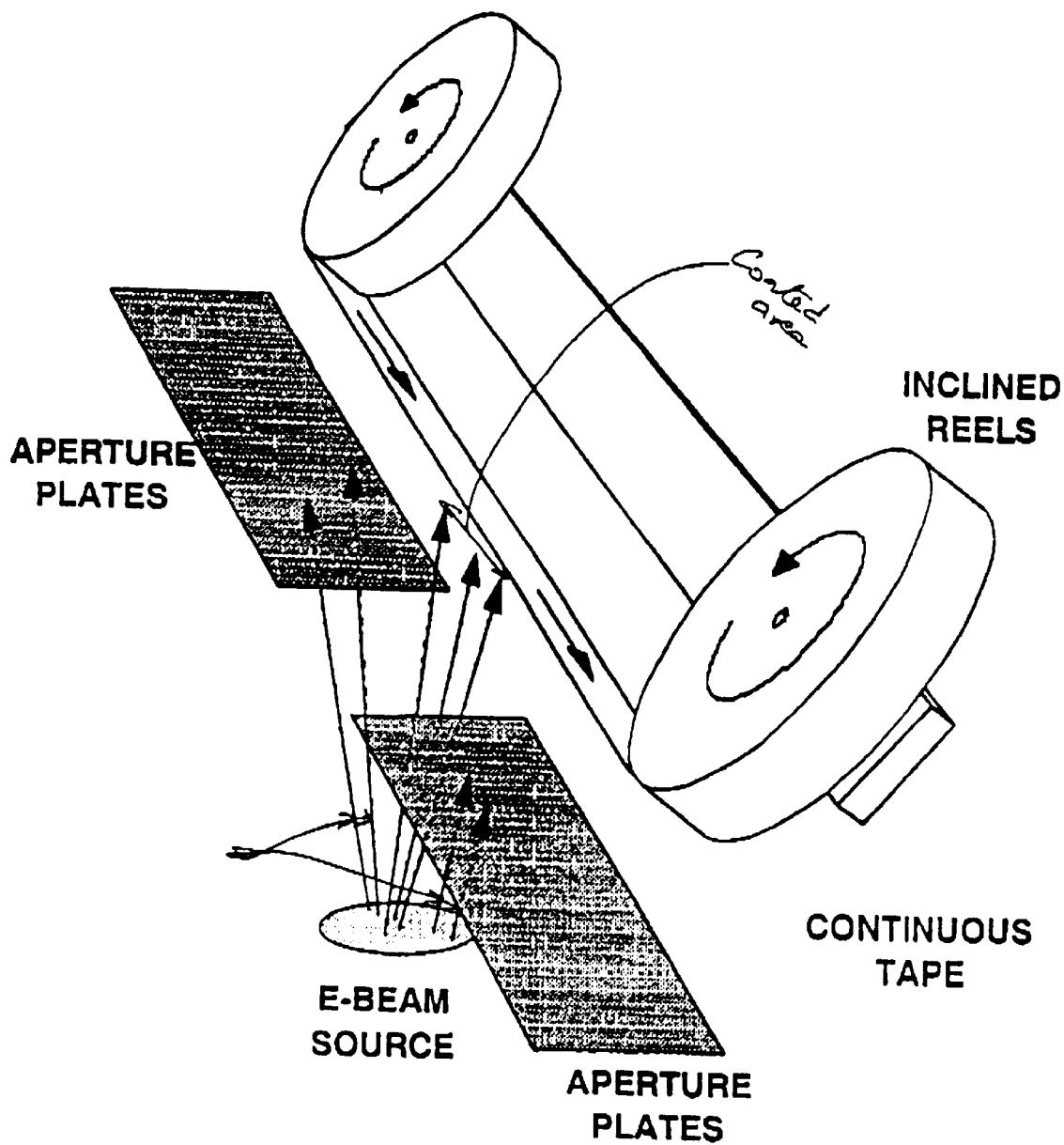
FIG. 4 is a schematic representation of shaped superconductors.
Figure 5:
FIG. 5 is a schematic representation of the inclined substrate method of depositing suitable polycrystalline material.
Figure 5:
Figure 5:

Referring now to FIG. 5, there is disclosed a representation of the inclined substrate deposition method in which an E-beam evaporator is used to deposit the polycrystalline vapor on a substrate at predetermined angle to the electron beam evaporator through a collimator. The angles between the electron beam evaporator and the inclined substrate or more specifically the angles of the substrate to the vapor flux produced by the electron beam evaporator may range from 40° to about 60°, preferably about 60° and in use has produced deposition rates of 50 Å per second as opposed to the 1.6 Å per second deposition rate of the IBAD system. The ability to deposit materials so quickly using the new inclined substrate deposition system wherein a continuous metal tape is passed through the electron beam evaporator using a collimator as shown in FIG. 3 to produce a continuous length of thick polycrystalline textured oxide material on a metal tape enables the production of bulk superconductors in which lengths in excess of 1 meter can be produced in relatively short time, enabling bulk superconductors to be made much more inexpensively than previously thought. The use of the collimator shown in FIG. 4 has enhanced the materials produced by the inclined substrate method by limiting the angles at which vaporized molecules can contact the substrate. Materials having satisfactory textures, that is misorientation angles not greater than about 15° and preferably not greater than about 10° can be manufactured rapidly and inexpensively utilizing the new inclined substrate deposition method.

The principal reasons for the success of the present invention is the discovery that biaxially textured layers or sheet materials which are relatively large and thick can be used to grow superconductor materials with low misorientation angles as opposed to the single crystal materials previously used in the prior art such as that described by Veal et al. in the aforementioned '431 patent. Moreover, although biaxially textured materials have been used previously, they have never been used in the thicknesses disclosed herein as seed materials for the production of superconductors using a melt process. It is also contemplated that the article illustrated in FIG. 2 can be further altered by cutting away the polycrystalline substrate material leaving only the superconductor material in the same general form as the polycrystalline textured substrate material used to grow the superconductor. This permits bulk superconductors to be manufactured having substantial lengths and areas and substantial thicknesses in far less time and more economically than previously thought.

Moreover, as illustrated in FIG. 4, the superconductor produced by the method of the invention can be of various shapes. For instance, arcuate or curved shapes can be made as illustrated in FIG. 4 or flat sheets as illustrated in FIG. 2.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A bulk superconductor having a thickness of not less than about 100 microns carried by a polycrystalline textured material having misorientation angles at the surface thereof not greater than about 15°.

2. The bulk superconductor of claim 1, wherein the superconductor thickness is not less than about 1000 microns.

3. The bulk superconductor of claim 1, wherein the superconductor thickness is not less than about 1 cm.

4. The bulk superconductor of claim 1, wherein the polycrystalline textured material is a sheet or layer.

5. The bulk superconductor of claim 1, wherein the superconductor has a flat surface.

6. The bulk superconductor of claim 1, wherein the superconductor has an arcuate surface.

7. The bulk superconductor of claim 1, wherein the substrate is multiple layers of polycrystalline material.

8. The bulk superconductor of claim 1, wherein the polycrystalline textured substrate includes an oxide.

9. The bulk superconductor of claim 8, wherein the polycrystalline textured substrate includes a face centered cubic oxide material.

10. The bulk superconductor of claim 9, wherein the face centered cubic oxide material is one or more of MgO, $SrTiO_3$, $LaAlO_3$, cubic stabilized $ZrO_2$, $PbTiO_2$, $Sr_2RuO_4$, $NdGaO_3$, $LaCrO_3$, $NdCrO_3$, $LaFeO_3$, $NdFeO_3$, $La_2CuO_4$, $RTiO_3$, where R is La or a rare earth, $GdFeO_3$.

11. The bulk superconductor of claim 9, wherein the polycrystalline textured substrate has a thickness of not less than about 25 microns and misorientation angles at the surface thereof not greater than about 10°.

12. The bulk superconductor of claim 10, wherein the superconductor includes one or more of Y based or Bi base or Tl based superconductor.

13. A bulk superconductor having a thickness of not less than about 100 microns and a surface area of not less than about 50 $cm^2$ carried by a polycrystalline textured material having a thickness not less than about 10 microns and misorientation angles at the surface thereof not greater than about 15°.

14. The bulk superconductor of claim 13, wherein superconductor thickness is not less than about 1000 microns.

15. The bulk superconductor of claim 14, wherein the superconductor has an arcuate surface.

16. The bulk superconductor of claim 13, wherein the surface area is not less than about 100 $cm^2$.

17. The bulk superconductor of claim 13, wherein the superconductor has a surface area not less than about 100 $cm^2$ and the substrate includes one or more layers of polycrystalline textured oxide having a thickness not less than about 25 microns and misorientation angles at the surface thereof of not greater than about 10°.

18. The bulk superconductor of claim 17, wherein the polycrystalline textured material includes a plurality of oxide layers.

19. A process of manufacturing a bulk superconductor having a thickness not less than about 100 microns, comprising providing a polycrystalline biaxially textured material having a thickness not less than about 10 microns and misorientation angles at the surface thereof not greater than about 15°, and providing a superconductor precursor powder in contact with the polycrystalline biaxially textured material and melting the precursor powders and thereafter cooling the melted powders to grow superconductor material using substantially the entire polycrystalline textured material as a seed to provide a superconductor having a thickness not less than about 100 microns carried by a polycrystalline biaxially textured substrate material.

20. The process of claim 19, and further including removing the substrate material leaving a superconductor having a thickness not less than about 100 microns.

21. The process of claim 19, wherein the thickness of the superconductor is not less than about 1000 microns.

22. The process of claim 21, wherein the thickness of the superconductor is not less than about 1 cm.

23. The process of claim 19, wherein the polycrystalline textured material includes one or more of an oxide layer.

24. The process of claim 19, wherein the superconductor is selected from one or more of a Y-based superconductor, a Bi-based superconductor and a Tl-based superconductor and a rare-earth-element based superconductor.

* * * * *